United States Patent
Uesawa

(10) Patent No.: US 7,517,638 B2
(45) Date of Patent: *Apr. 14, 2009

(54) METHOD OF MANUFACTURING A SEMICONDUCTOR APPARATUS WITH A TAPERED APERTURE PATTERN TO FORM A PREDETERMINED LINE WIDTH

(75) Inventor: Fumikatsu Uesawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 403 days.

This patent is subject to a terminal disclaimer.

(21) Appl. No.: 11/070,461

(22) Filed: Mar. 2, 2005

(65) Prior Publication Data

US 2005/0176257 A1    Aug. 11, 2005

Related U.S. Application Data

(63) Continuation of application No. 10/720,851, filed on Nov. 24, 2003, now Pat. No. 6,953,746, which is a continuation of application No. 10/154,237, filed on May 23, 2002, now Pat. No. 6,716,747.

(30) Foreign Application Priority Data

May 23, 2001   (JP)   ............................. 2001-153326

(51) Int. Cl.
    *G03F 7/00*   (2006.01)
(52) U.S. Cl. .................... 430/311; 430/313; 430/317; 430/322; 430/323
(58) Field of Classification Search .................. 430/313, 430/317, 322, 323
    See application file for complete search history.

(56) References Cited

U.S. PATENT DOCUMENTS

| | | | |
|---|---|---|---|
| 4,409,319 A | 10/1983 | Colacino et al. | |
| 4,702,792 A | 10/1987 | Chow et al. | |
| 4,816,115 A | 3/1989 | Horner et al. | |
| 5,034,091 A | 7/1991 | Trask et al. | |
| 5,750,441 A * | 5/1998 | Figura et al. | 438/751 |
| 5,858,824 A * | 1/1999 | Saitoh | 438/167 |
| 5,913,148 A | 6/1999 | Hills | |
| 5,981,913 A | 11/1999 | Kadomura et al. | |
| RE36,663 E | 4/2000 | Smith et al. | |
| 6,171,951 B1 | 1/2001 | Lee et al. | |
| 6,194,128 B1 * | 2/2001 | Tao et al. | 430/313 |
| 6,387,798 B1 | 5/2002 | Loke et al. | |
| 6,399,286 B1 | 6/2002 | Liu et al. | |
| 6,514,868 B1 | 2/2003 | Hui et al. | |
| 6,649,517 B2 | 11/2003 | Teh et al. | |
| 6,953,746 B2 * | 10/2005 | Uesawa | 438/640 |

* cited by examiner

*Primary Examiner*—Mark F Huff
*Assistant Examiner*—Caleen O Sullivan
(74) *Attorney, Agent, or Firm*—Sonnenschein Nath & Rosenthal LLP

(57) ABSTRACT

When a hole pattern is formed on a film to be processed, a matching deviation margin at a lithography step is reserved by making a diameter of a bottom of a hole substantially equal to a diameter of an aperture of the hole. The method for manufacturing the semiconductor apparatus includes the steps of: forming a (first) mask material film on a film to be processed; forming a tapered open pattern on the (first) mask material film; and etching the film to be processed by using the (first) mask material film as a mask.

19 Claims, 2 Drawing Sheets

PRIOR ART

METHOD OF MANUFACTURING A SEMICONDUCTOR APPARATUS WITH A TAPERED APERTURE PATTERN TO FORM A PREDETERMINED LINE WIDTH

CROSS REFERENCES TO RELATED APPLICATIONS

The present application is a continuation of co-pending U.S. application Ser. No. 10/720,851 filed on Nov. 24, 2003, which is a continuation of co-pending U.S. application Ser. No. 10/154,237 filed on May 23, 2002, which claims priority to Japanese Application No. 2001-153326 filed on May 23, 2001, all of which are hereby incorporated by reference.

BACKGROUND OF THE INVENTION

1. Field of the Invention

The present invention relates to a manufacturing method for a semiconductor apparatus, and in detail, the present invention particularly relates to such a manufacturing method for a semiconductor apparatus, wherein a micro wiring pattern is formed.

2. Description of the Related Art

In recent years, the miniaturization of a wiring pattern has been quickly advanced in order to improve the degree of integration and the property of an LSI. The techniques for miniaturizing a gate length in order to improve the property of a transistor and for opening a contact hole smaller than that of a conventional contact hole in order to improve the degree of integration have been strongly requested. It is well known that a limit resolution (R) in an optical lithography process to determine the minimum size of the LSI is represented by the following equation (1):

$$R = k \times \lambda / NA \quad (1)$$

In this case, $\lambda$ is a wave-length of a light source, NA is the numerical aperture in a projection lens, and k is a constant having a value of about 0.5.

That is, in order to attain the lithography process having a resolution higher than that of the conventional one, it is desirable to select a light source having a shorter wave-length. Because of this reason, a photolithography machine, which uses a krypton fluorine (KrF) excimer laser having a wave-length of 248 nm as a light source, is used in a field of manufacturing an high technology device. However, NA of a current exposing apparatus is 0.68 at its maximum. Thus, even the latest KrF excimer laser photolithography machine has only a resolution of about 0.18 µm. However, the resolution derived from the equation (1) is applied to a banded pattern typically referred to as a line and space. Then, the resolution of the contact hole pattern has a limit of about 0.22 µm.

On the other hand, a technique for opening a micro contact hole, having a diameter of 0.15 µm is requested in a device of 0.13 µm generation. This is the size that can not be easily attained even by using an argon fluorine (ArF) excimer laser photolithography machine, which is expected as a next generation photolithography machine using a light source having a wave length of 193 nm.

As one method of solving this problem, a technique for carrying out an etching process so as to give a taper to a side wall of a hole 112 formed on a film 111 to be processed by using a resist mask 121 is known and thereby finishing it to a desired hole diameter at a bottom 112b of the hole 112, as shown in FIG. 3.

However, as shown in FIG. 4, in the above-mentioned conventional method, even if a desired hole diameter (a hole diameter on design) Db is obtained at the bottom 112b of the hole 112, a diameter Dt at an upper end (aperture) 112t of the hole 112 becomes greater than the desired size (a size on the design). This results in a problem that a sufficient matching margin can not be obtained at a later lithography process. For example, this has a problem that a distance d from a wiring 13I placed adjacently to the hole 112 is made narrower.

The present invention is a manufacturing method for a semiconductor apparatus proposed in order to solve the above-mentioned problems.

SUMMARY OF THE INVENTION

The manufacturing method of a semiconductor apparatus of the present invention includes the steps of: forming a mask material film made of organic insulation film on a film to be processed; forming a tapered opening pattern or aperture pattern, in which a bottom is narrower than an open side on the mask material film; and etching the film to be processed using the mask material film as a mask.

In accordance with the manufacturing method of the semiconductor apparatus, after the mask material film is formed on the film to be processed, the tapered aperture pattern that is narrower at the bottom side than at the aperture side is formed on the film to be processed, and thereby it is possible to able to form the bottom of the aperture pattern at the desired micro dimension exceeding the limit of the lithography technology. The film to be processed is then etched by applying thus-processed mask material film as a mask, thereby, the film to be processed can be vertically etched to the micro dimension exceeding the limit of the lithography technology.

As mentioned above, according to the manufacturing method of the semiconductor apparatus of the present invention, after the mask material film is formed on the film to be processed, the tapered aperture pattern in which the bottom is narrower than the aperture side is formed on this mask material film. Thus, the bottom of the aperture pattern can be formed at the desirable micro dimension exceeding the limit of the lithography technique. The thus-processed mask material film is used as the mask, and the film to be processed is etched. Hence, the film to be processed can be vertically etched to the micro dimension exceeding the limit of the lithography technique. Therefore, since the film to be processed can be processed under the excellently controlling performance with regard to the size, the matching margin is never decreased differently from the conventional direct taper etching method.

DETAILED DESCRIPTION OF THE PREFERRED EMBODIMENT

One embodiment of a manufacturing method for a semiconductor apparatus according to the present invention will be described below with reference to a sectional view of manufacturing steps of FIGS. 1A to 1E.

Figure 1A:
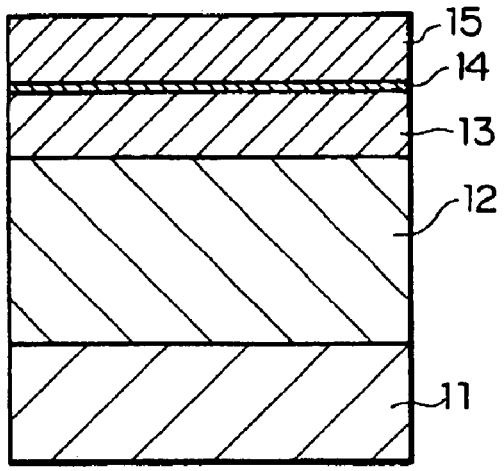
FIGS. 1A to 1E are sectional views of manufacturing steps showing an embodiment according to a manufacturing method for a semiconductor apparatus according to the present invention.

As shown in FIG. 1A, a film 12 to be processed made of, for example, silicon oxide film is formed on a substrate 11. Next, a first mask material film (mask material film) 13 made of an organic insulation film is formed on the film 12 to be processed. A dielectric film having low dielectric constant is used as this organic insulation film. The material referred to as the low dielectric film is the material having a lower dielectric constant than that of $SiO_2$, and is originally developed in order to reduce an inter-wiring capacitance of an LSI. For example, FLARE made by Honeywell Co., Ltd., SILK made by Dow Chemical Ltd. and the like are known as such material. Those organic system materials have a high heatproof temperature of 350° C. Thus, they can be positively used even as a hard mask material in a process for manufacturing a semiconductor. Hence, they can be used to form a micro hole pattern.

Moreover, a second mask material film 14, which serves as an etching mask to this first mask material film 13 and is made of, for example, an oxide film, is formed on the first mask material film 13. Moreover, a resist film 15 is formed on the second mask material film 14. The mask material film 14 is made of, for example, a silicon oxide film. With regard to this silicon oxide film, if it is the silicon oxide film serving as the etching mask to the first mask material film 13, a silicon oxide film formed by a chemical vapor deposition, a silicon oxide film of a coating type such as SOG film and the like can be used, and accordingly the film forming method is not specified. As mentioned above, the low dielectric film has the high heatproof property although it is the organic film. Thus, it can be sufficiently endured in the process for forming the mask material film 14 made of the oxide film by using the chemical vapor deposition.

Figure 1D:
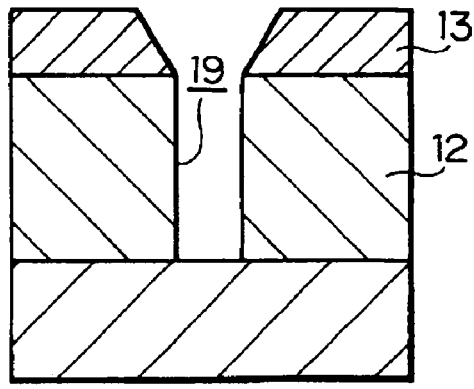
Figure 1B:
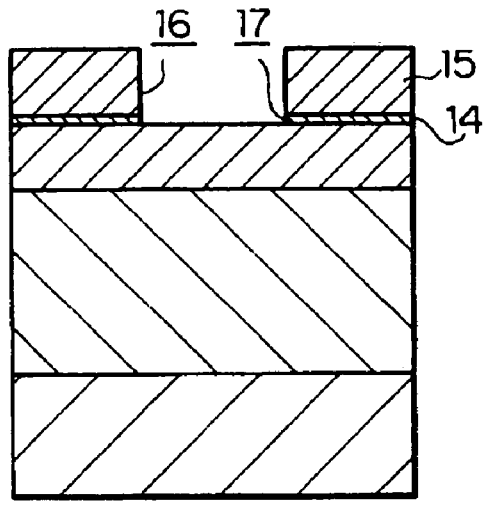

Then, as shown in FIG. 1B, the usual lithography process is carried out under this condition, and an aperture pattern 16 is formed on the resist film 15. As mentioned above, the formable pattern size at this time is limited by the limit resolution of the lithography technique. If the defect of the lithography process causes a line width and a positional deviation to depart from a range of a specification, it is possible to apply a reproducing process through a usual resist ashing. Even if a resist reproducing process is carried out, the second mask material film 14 is formed on the low dielectric film. Thus, the low dielectric film is protected by this second mask material film 14. Hence, the low dielectric film is never ashed in carrying out the reproducing process.

When the lithography process is completed without any trouble, the resist film 15 on which the aperture pattern 16 is formed is used as the mask, and the second mask material film 14 is etched to thereby form an aperture pattern 17.

Figure 1E:
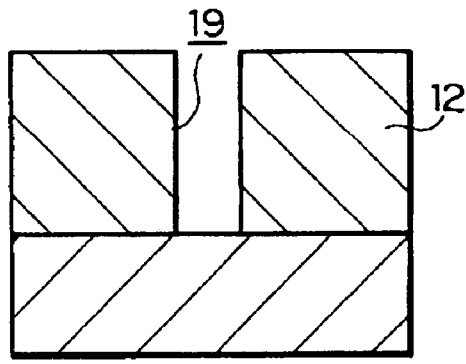
Figure 1C:
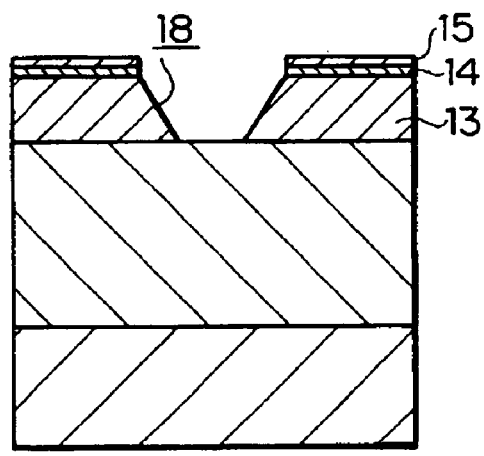

Next, as shown in FIG. 1C, the resist film 15 is used as the etching mask, and the first mask material film 13 made of the low dielectric film is etched. This etching is done such that in an open pattern 18 formed on the first mask material film 13, a bottom side is narrower than an aperture side, and its sidewall becomes taper-shaped. Actually, the taper etching can be carried out by setting a temperature of the substrate to a low temperature (for example, −50° C. to 0° C.).

Usually, the deposition reaction and the etching reaction are mixed in an etching chamber. The deposition reaction is easily carried out by lowering the temperature of the substrate. Thus, it is possible to process the taper shape. Ammonia ($NH_3$), mixed gas of hydrogen ($H_x$) and nitrogen ($N_2$), oxygen ($O_2$) and the like are used as the etching gas for the low dielectric film. In addition, a method of etching the organic insulation film to the taper shape in an excellently controlling manner is disclosed in Japanese Patent Publication No.H7-27886. According to this method, an aperture having a desirable taper angle can be formed, for example, by changing a content of phloro-carbon gas in the etching gas.

In the above-mentioned etching process, when the first mask material film 13 is etched, the resist film 15 is also etched and removed. Then, when the resist film 15 is perfectly removed, the second mask material film 14 serves as the etching mask, and the etching is further advanced.

Next, as shown in FIG. 1D, the first mask material film 13 is used as the etching mask, and the usual etching for the vertical processing is carried out. Consequently, an aperture pattern 19, which is further miniaturized over the size formed by the lithography process, is formed on the film 12 to be processed. In the etching at this time, the second mask material film 14 [refer to FIG. 1C] formed on the upper layer is desired to be formed in advance at a film thickness to be etched simultaneously with the film 12 to be processed.

After that, as shown in FIG. 1E, the first mask material film 13 made of the low dielectric film that is already unnecessary [refer to FIG. 1D] is removed by carrying out the ashing process similar to the resist removal. As a result, the aperture pattern 19 less than the resolution limit of the lithography technique can be formed on the film 12 to be processed.

Figure 2:
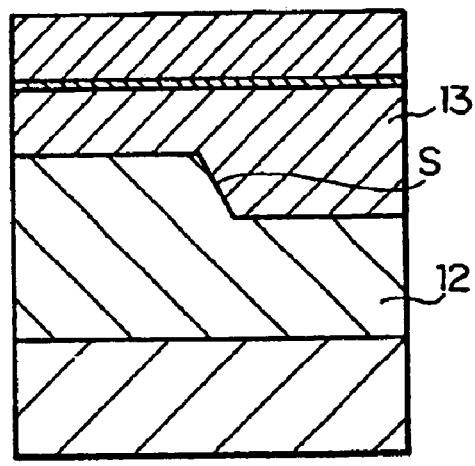
FIG. 2 is a sectional view of a schematic configuration for describing a case in which a film to be processed has a step.
Figure 3:
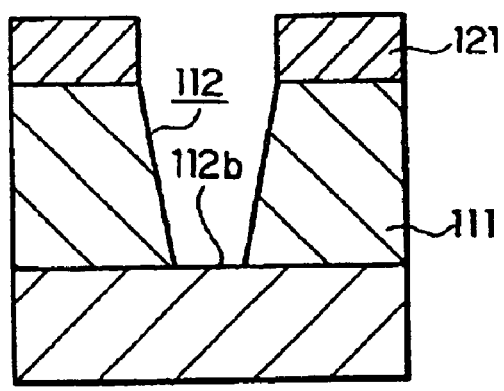
FIG. 3 is a sectional view of a schematic configuration for describing a conventional technique.
Figure 4:
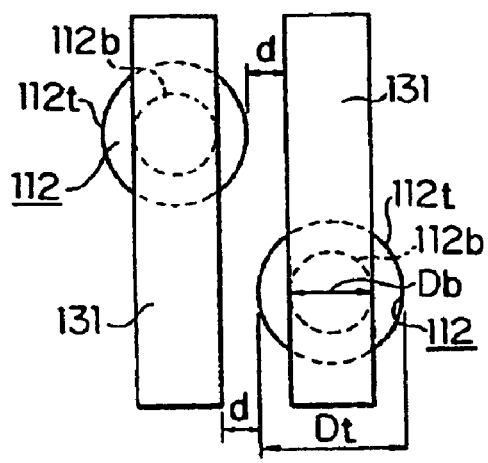
FIG. 4 is a sectional view of a schematic configuration for describing a problem.

As compared with the method of reducing the hole diameter (or the slit width) at the bottom by performing the taper etching on the film itself to be processed that is typically used, the method of the present invention can carry out the vertical processing of the film 12 to be processed. Thus, for example, when the aperture pattern 19 is the hole pattern, its control of the hole diameter thereof becomes easy. The problem of the lack of the matching margin as described in the problem is never induced. Also, as shown in FIG. 2, when the film 12 to be processed has a step S, the first mask material film 13 can function as a flattened layer. Thus, this method has the merit that the lithography step is advantageous.

When the above-mentioned manufacturing method is used to form the contact hole pattern, as the example, the lithography process is carried out to thereby form the aperture pattern 16 composed of the contact hole pattern having the diameter of 0.22 μm on the resist film 15. Then, for the first mask material film 13 made of the low dielectriic film, the taper etching is used to finally obtain the aperture pattern 18 having the bottom diameter of 0.15 μm. When this first mask material film 13 is used as the etching mask and the film 12 to be processed is vertically etched, the aperture pattern 19 having a diameter of 0.15 μm is obtained.

A KrF excimer laser exposing apparatus (an exposure wave length=248 nm) in which NA=0.68 and σ=0.75 is used as the optical condition to expose the resist film 15. As the resist film, for example, R11JE made by JSR Corporation is used, and its film thickness is defined as 0.4 μm. Also, a parallel flat plate type of a plasma etching apparatus is used to etch the film 12 to be processed, and ammonium ($NH_3$) is used for the etching gas, and the temperature of the substrate is set to 0°C.

As mentioned above, the case in which the optical lithography is carried out to thereby form the micro contact hole pattern is exemplified. However, the present invention can be also applied to an electron beam lithography, an ion beam lithography and an X-ray lithography. Moreover, it can be applied not only to the contact hole but also the formation of the micro slit pattern.

What is claimed is:

1. A method of manufacturing a semiconductor apparatus comprising:
    providing a film to be processed on a substrate, wherein the film to be processed has a varying thickness and the substrate has a uniform thickness;
    providing a first dielectric mask material film on said film to be processed, the first dielectric mask material film having a dielectric constant lower than silicon dioxide and a heatproof temperature of about 350 degrees Centigrade;
    forming a second mask on the first dielectric mask material;
    providing a resist film on the second dielectric mask material film;
    forming a first vertical aperture pattern on said resist film;
    using said resist film as a mask;
    etching said first dielectric mask material film to form an open pattern using the mask, said open pattern being formed with tapered sides such that a bottom of said open pattern is narrower than a first vertical aperture pattern side of said open pattern; and
    forming a second vertical aperture pattern in said film to be processed by etching said film to be processed,
    wherein the bottom of the open pattern is formed at a desirable micro dimension exceeding capabilities of lithography techniques.

2. The method of manufacturing a semiconductor apparatus according to claim 1 wherein providing the film to be processed on the substrate includes disposing the film to be processed directly on the substrate.

3. A method of providing a reduced contact hole diameter in a semiconductor apparatus comprising:
    providing a film to be processed on a substrate, the film to be processed having a varying thickness along a step;
    disposing a first dielectric mask material film on said film to be processed such that the first dielectric mask material film has a varying thickness that corresponds to the varying thickness of the film to be processed such that the dielectric mask planarizes an unevenness created by said step;
    providing a resist film on the first dielectric mask material film;
    forming an aperture pattern on said resist film;
    using a mask to etch said dielectric mask material film to form an open pattern, said open pattern being formed with tapered sides such that a bottom of said open pattern is narrower than an aperture pattern side of said open pattern, wherein said bottom of said open pattern is formed at a desirable micro dimension exceeding capabilities of lithography techniques; and
    vertically etching said film to be processed to obtain the reduced contact hole diameter.

4. The method of manufacturing a semiconductor apparatus according to claim 1 wherein the varying thickness of the film to be processed is along a step portion.

5. The method of manufacturing a semiconductor apparatus according to claim 1, further comprising:
    providing the second mask material film between said resist film and said first dielectric mask material film.

6. The method of manufacturing a semiconductor apparatus according to claim 1, wherein the second mask material film is a silicon oxide film.

7. The method of manufacturing a semiconductor apparatus according to claim 1, further comprising:
    using the resist film as the mask when the forming the first vertical aperture pattern on said resist film is completed according to a predetermined width.

8. The method of manufacturing a semiconductor apparatus according to claim 1, further comprising:
    etching the second mask material film to form a third vertical aperture pattern when the forming the first vertical aperture pattern on said resist film is completed according to a predetermined width.

9. The method of manufacturing a semiconductor apparatus according to claim 1, further comprising
    using the second mask material film as a protective mask when the forming the first vertical aperture pattern on said resist film is not completed according to a predetermined width.

10. The method of providing a reduced contact hole diameter in the semiconductor apparatus according to claim 3 wherein the substrate has a uniform thickness.

11. The method of providing a reduced contact hole diameter in the semiconductor apparatus according to claim 3 wherein providing the resist film on the first dielectric mask material film includes disposing the resist film indirectly on said first dielectric mask material film.

12. The method of providing a reduced contact hole diameter in the semiconductor apparatus according to claim 3, further comprising:
    providing a second mask material film between the resist film and said first dielectric mask material film.

13. The method of providing a reduced contact hole diameter in the semiconductor apparatus according to claim 3, wherein the step of using a mask to etch the dielectric mask material film to form an open pattern includes determining a factor which can be used to control sizing of the open pattern.

14. The method of providing a reduced contact hole diameter in the semiconductor apparatus according to claim 13, wherein the factor indicates whether the formation of the open pattern on said resist film matches a predetermined width.

15. The method of providing a reduced contact hole diameter in the semiconductor apparatus according to claim 12, wherein the mask includes the resist film and the second mask material film.

16. The method of providing a reduced contact hole diameter in the semiconductor apparatus according to claim 12, further comprising:
    etching the second mask material film to form a third vertical aperture pattern when the forming the aperture pattern on said resist film is completed according to a predetermined width.

17. The method of providing a reduced contact hole diameter in the semiconductor apparatus according to claim 12, further comprising
    using the second mask material film as a mask to protect said first dielectric mask material film when the forming the first vertical aperture pattern on said resist film is not completed according to a predetermined width.

18. The method of manufacturing a semiconductor apparatus according to claim 1 wherein the film to be processed has a first film surface that runs both parallel and nonparallel to a second film surface.

19. The method of manufacturing a semiconductor apparatus according to claim 18 wherein the first film surface is an upper film surface and second film surface is a lower film surface.

* * * * *